(12) United States Patent
Ram et al.

(10) Patent No.: US 10,043,925 B2
(45) Date of Patent: Aug. 7, 2018

(54) GUIDED-WAVE PHOTODETECTOR APPARATUS EMPLOYING MID-BANDGAP STATES OF SEMICONDUCTOR MATERIALS, AND FABRICATION METHODS FOR SAME

(71) Applicant: Massachusetts Institute of Technology, Cambridge, MA (US)

(72) Inventors: Rajeev Jagga Ram, Arlington, MA (US); Jason Scott Orcutt, Katonah, NY (US); Huaiyu Meng, Medford, MA (US); Amir H. Atabaki, North Quincy, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 0 days.

(21) Appl. No.: 15/250,594

(22) Filed: Aug. 29, 2016

(65) Prior Publication Data

US 2017/0062636 A1    Mar. 2, 2017

Related U.S. Application Data

(60) Provisional application No. 62/210,489, filed on Aug. 27, 2015.

(51) Int. Cl.
*H01L 31/0232* (2014.01)
*H01L 27/144* (2006.01)
(Continued)

(52) U.S. Cl.
CPC .... *H01L 31/02327* (2013.01); *H01L 27/1443* (2013.01); *H01L 31/03682* (2013.01);
(Continued)

(58) Field of Classification Search
CPC .............. G02F 1/025; G02F 2202/104; G02F 2202/105; G02B 6/10; G02B 6/12002;
(Continued)

(56) References Cited

U.S. PATENT DOCUMENTS

| | | | |
|---|---|---|---|
| 2002/0109153 A1* | 8/2002 | Ker | H01L 27/0251 257/199 |
| 2012/0002694 A1 | 1/2012 | Bowers et al. | |
| 2012/0213468 A1 | 8/2012 | Lipson et al. | |

OTHER PUBLICATIONS

Casalino et al., "Near-Infrared Sub-Bandgap All-Silicon Photodetectors: State of the Art and Perspectives," *Sensors* (2010) 10: 10571-10600.
(Continued)

*Primary Examiner* — Tucker J Wright
(74) *Attorney, Agent, or Firm* — Cooley LLP

(57) ABSTRACT

Guided-wave photodetectors based on absorption of infrared photons by mid-bandgap states in non-crystal semiconductors. In one example, a resonant guided-wave photodetector is fabricated based on a polysilicon layer used for the transistor gate in a SOI CMOS process without any change to the foundry process flow ('zero-change' CMOS). Mid-bandgap defect states in the polysilicon absorb infrared photons. Through a combination of doping mask layers, a lateral p-n junction is formed in the polysilicon, and a bias voltage applied across the junction creates a sufficiently strong electric field to enable efficient photo-generated carrier extraction and high-speed operation. An example device has a responsivity of more than 0.14 A/W from 1300 to 1600 nm, a 10 GHz bandwidth, and 80 nA dark current at 15 V reverse bias.

29 Claims, 14 Drawing Sheets

(51) Int. Cl.
   *H01L 31/0352* (2006.01)
   *H01L 31/0368* (2006.01)
   *H01L 31/103* (2006.01)
(52) U.S. Cl.
   CPC .... *H01L 31/035281* (2013.01); *H01L 31/103* (2013.01); *Y02E 10/546* (2013.01)
(58) Field of Classification Search
   CPC ................ G02B 6/12004; G02B 6/122; G02B 2006/12097; H01L 27/1203; H01L 31/02327; H01L 31/028; H01L 31/02005
   See application file for complete search history.

(56) References Cited

OTHER PUBLICATIONS

International Search Report and Written Opinion issued by the International Searching Authority for PCT Application No. PCT/US16/49292, dated Nov. 16, 2016, 10 pages.
Knights et al., "Silicon-on-insulator waveguide photodetector with self-ion-implantation-engineered-enhanced infrared response," *Journal of Vacuum Science & Technology A* (May 4, 2006) 24 (3): 783-786.
Meng et al., "Sub-bandgap polysilicon photodetector in zero-change CMOS process for telecommunication wavelength," *Optical Society of America* (Dec. 14, 2015) 23 (25): 32643-32653.
Orcutt et al., "Open foundry platform for high-performance electronic-photonic integration," *Optical Society of America* (May 21, 2012) 20 (11): 12222-12232.
Ackert, J. J. et al., "10 Gbps silicon waveguideintegrated infrared avalanche photodiode," Opt. Express 21, pp. 19530-19537 (2013).
Alloati, L. et al., "Waveguide-coupled detector in zero-change complementary metaloxidesemiconductor," Appl. Phys. Lett. 107, pp. 041104-1-041104-4 (2015).
Assefa, S. et al., "A 90nm CMOS integrated Nano-Photonics technology for 25Gbps WDM optical communications applications," in IEEE International Electron Devices Meeting (IEDM) pp. 33.8.1-33.8.3 (IEEE, 2012).
Batten, C. et al., "Building many-core processor-to-dram networks with monolithic cmos silicon photonics," IEEE Micro. 29, 8-21 (2009).
Debnath, K. et al., "Dielectric waveguide vertically coupled to all-silicon photodiodes operating at telecommunication wavelengths," Appl. Phys. Lett. 102, pp. 171106-1-171106-4 (2013).
Geis, M. W. et al., "CMOS-compatible all-Si high-speed waveguide photodiodes with high responsivity in near-infrared communication band," IEEE Photonics Technol. Lett. 19, pp. 152-154 (2007).
Geis, M. W. et al., "Silicon waveguide infrared photodiodes with 35 GHz bandwidth and phototransistors with 50 AW(-1) response," Opt. Express 17, pp. 5193-5204 (2009).
Georgas, M. et al., "A monolithically-integrated optical transmitter and receiver in a zero-change 45nm SOI process," in Symposium on VLSI Circuits pp. 1-2 (2014).
Inaba, S. et al., "High performance 35 nm gate length CMOS with NO oxynitride gate dielectric and Ni salicide," IEEE Trans. Electron Devices 49, pp. 2263-2270 (2002).
Kato, M. et al., "10 Channel, 28 Gbaud PM-QPSK, monolithic InP terabit superchannel receiver PIC," IEEE Photonics Conf., pp. 340-341 (2011).
Kim, Y. W. et al., "50nm gate length logic technology with 9-layer Cu interconnects for 90nm node SoC applications," in IEEE International Electron Devices Meeting (IEDM) pp. 69-72 (IEEE, 2002).
Matsushima, O. et al., "A high-sensitivity broadband image sensor using CuInGaSe2 thin films," in IEEE International Electron Devices Meeting (IEDM) pp. 1-4 (IEEE, 2008).
Mehta, K. K. et al., "High-Q CMOSintegrated photonic crystal microcavity devices," Sci. Rep. 4, 4077 pp. 1-6 (2014).
Mehta, K. K. et al., "Polycrystalline silicon ring resonator photodiodes in a bulk complementary metal-oxide-semiconductor process," Opt. Lett. 39, pp. 1061-1064 (2014).
Mekis, A. et al., "A CMOS photonics platform for high-speed optical interconnects," in IEEE Photonics Conference (IPC) (IEEE, 2012), pp. 356-357.
Niclass, C. et al., "Design and characterization of a CMOS 3-D image sensor based on single photon avalanche diodes," IEEE J. Solid-State Circuits 40, pp. 1847-1854 (2005).
Orcutt, J. S. et al., "Nanophotonic integration in state-of-the-art CMOS foundries," Opt. Express 19, pp. 2335-2346 (2011).
Orcutt, J. S. et al., "Low-loss polysilicon waveguides fabricated in an emulated high-volume electronics process," Opt. Express 20, pp. 7243-7254 (2012).
Pralle, M. U. et al., "IR CMOS: infrared enhanced silicon imaging," in SPIE Defense, Security and Sensing, paper 870407-1-7 (2013).
Preston, K. et al., "Waveguide-integrated telecom-wavelength photodiode in deposited silicon," Opt. Lett. 36, pp. 52-54 (2011).
Shainline, J. M. et al., "Depletion-mode carrier-plasma optical modulator in zero-change advanced CMOS," Opt. Lett. 38, pp. 2657-2659 (2013).
Sood, A.K. et al., "Design and development of wafer-level short wave infrared micro-camera," in SPIE Defense, Security and Sensing, pp. 870439-870410 (SPIE, 2013).
Sun, J. et al., "Large-scale nanophotonic phased array," Nature 493, pp. 195-199 (2013).
Sun C. et al., "A 45nm SOI monolithic photonics chip-to-chip link with bit-statistics-based resonant microring thermal tuning," in Symposium on VLSI Circuits, pp. C122-C123 (2015).
Wada, K. et al., "Si photonics and fiber to the home," Proc. IEEE 97, pp. 1329-1336 (2009).
Wade, M. T. et al., "Energy-efficient active photonics in a zero-change, state-of-the-art CMOS process," in Optical Fiber Communications Conference and Exhibition, pp. 1-3 (OFC, 2014).
Yaacobi, A. et al., "Integrated phased array for wideangle beam steering," Opt. Lett. 39, pp. 4575-4578 (2014).
Zhu, H. K. et al., "All-silicon waveguide avalanche photodetectors with ultrahigh gain-bandwidth product and low breakdown voltage," IEEE J. Sel. Top. Quantum Electron. 20, pp. 1-6 (2014).

* cited by examiner

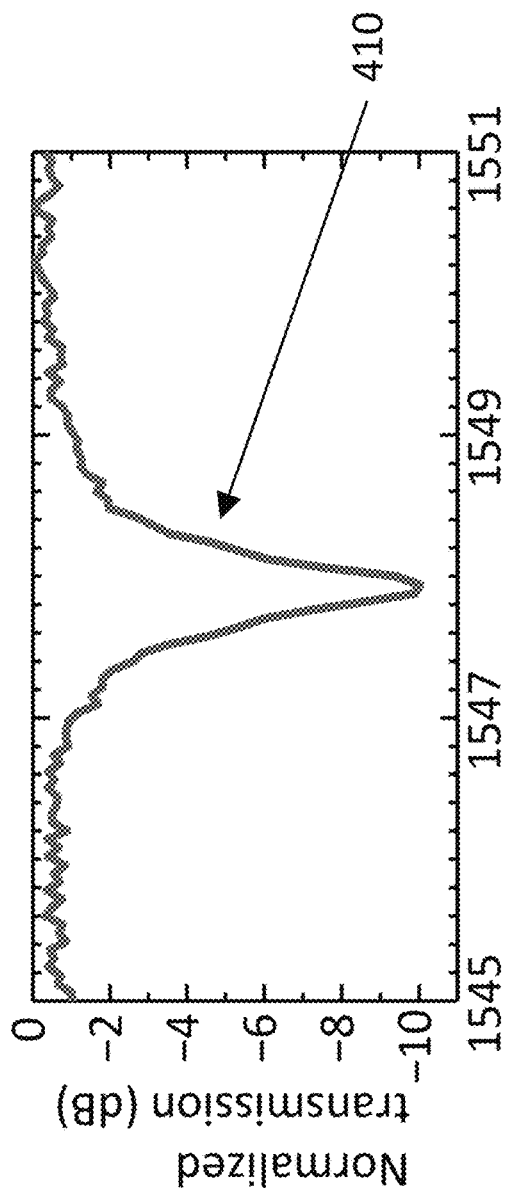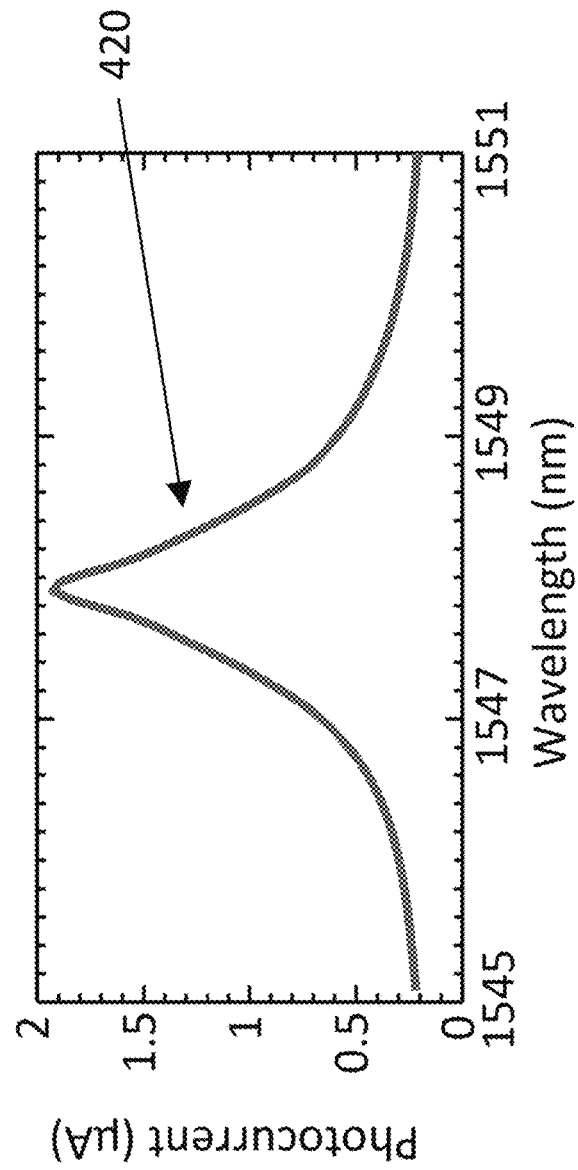
FIG. 4A
FIG. 4B

GUIDED-WAVE PHOTODETECTOR APPARATUS EMPLOYING MID-BANDGAP STATES OF SEMICONDUCTOR MATERIALS, AND FABRICATION METHODS FOR SAME

CROSS-REFERENCE TO RELATED APPLICATION(S)

This application claims a priority benefit, under 35 U.S.C. § 119(e), to U.S. provisional application Ser. No. 62/210,489, entitled "Guided-Wave Photodetectors Using Mid-Bandgap States," and filed on Aug. 27, 2015, which application is hereby incorporated by reference herein.

GOVERNMENT SUPPORT

This invention was made with Government support under Contract No. HR0011-10-1-0079 and Contract No. HR0011-11-C-0100 awarded by the Defense Advanced Research Projects Agency. The Government has certain rights in the invention.

BACKGROUND

Semiconductor electronic devices are made in foundries, of which there are over a hundred worldwide (operated by approximately two dozen or so semiconductor companies adopting a foundry model). Fabrication of large-scale integrated semiconductor electronic devices requires multiple process steps and mask layers that define etching and deposition patterns (e.g., for photoresists), dopant implants, and metallization. A semiconductor foundry may employ a particular set of process steps and mask layers for a given semiconductor device, and process steps/mask layers can differ significantly for different types of semiconductor devices (as well as similar devices made by different foundries). A particular set of process steps and mask layers employed by a given foundry to fabricate any of a variety of semiconductor devices is generally referred to as a "semiconductor manufacturing process technology" (or simply "semiconductor technology"). For fabrication of silicon-based Complimentary-Metal-Oxide-Semiconductor (CMOS) devices, different manufacturing process technologies are sometimes commonly referred to as "CMOS technology nodes." Some common examples of conventional CMOS technology nodes include a 45-nm silicon-on-insulator (SOI) process technology available from IBM (i.e., the IBM SOI12S0 45-nm technology), as well as the IBM SOI13S0 32 nm technology and the IBM 10LPE technology.

One area of developing research in computing relates to monolithic integration of million-to-billion-transistor circuits with photonic components as an enabling technology for high performance computers (HPC). Generally speaking, "photonic components" refer to various devices employed for light (or photon) generation or emission, transmission or propagation, modulation (e.g., signal processing, switching, filtering, wavelength and/or mode selectivity, amplification), and detection. Optical processing techniques enabled by photonic components can accelerate computation in HPCs by performing processor-intensive tasks at significantly faster rates and with a significant reduction in energy consumption as compared to purely electronic processing techniques. Accordingly, the integration of photonic components and electronic components for computing and other applications is an active area of research endeavor.

In connection with photonic detection devices (referred to generally as "photodetectors"), some investigated approaches for design and fabrication of photodetectors rely on specialized materials, processes and/or geometries that are particularly useful for fabrication of photonics components, but generally are not readily available in conventional semiconductor manufacturing process technologies employed in advanced electronic foundries. Moreover, the modifications required of conventional semiconductor technologies to accommodate photonic components generally involve costly process development that in turn creates challenges in maintaining fabrication yield.

SUMMARY

The present disclosure relates generally to infrared photodetectors that are capable of detecting electromagnetic radiation (also referred to herein generally as "light") at wavelengths above 1 micrometer (e.g., wavelengths conventionally employed for Ethernet data applications and telecommunication applications). In various implementations, such photodetectors are based at least in part on absorption of electromagnetic radiation (e.g., photons) by mid-bandgap states in a semiconductor material. For purposes of the present disclosure, such mid-bandgap states also may be referred to herein as "sub-bandgap states." In one aspect, such mid-bandgap or sub-bandgap states arise from defects in the semiconductor material.

As discussed in detail further below, in one exemplary implementation a semiconductor photodetector apparatus may be fabricated by employing two different semiconductor materials, at least one of which is non-crystal. With respect to propagating electromagnetic radiation (light) to be detected by the photodetector apparatus, the light is confined in a guided-wave structure, and photons of the guided light having certain wavelengths are absorbed by a non-crystal semiconductor material to generate electron-hole pairs, or "photo-generated carriers." Examples of non-crystal semiconductor materials having mid-bandgap states that may be employed for absorption of infrared photons and generation of electron-hole pairs according to the inventive concepts disclosed herein include, but are not limited to, poly-crystalline silicon ("polysilicon" or pSi), poly-crystalline silicon germanium (pSiGe), amorphous silicon (aSi), and amorphous silicon germanium (aSiGe).

In some implementations, the inventive guided-wave photodetector apparatus disclosed herein employ an "inverse ridge waveguide structure" to confine light. In one example, an inverse ridge waveguide structure comprises a semiconductor material (or dielectric material with a refractive index high enough for light confinement) that is patterned or otherwise formed as a narrow ridge. Another semiconductor material (e.g., a non-crystal semiconductor material) is then disposed over the narrow ridge and formed as wide cap to create an inverse ridge waveguide. For example, crystalline silicon may be patterned to form a relatively narrow ridge in which light is confined by disposing a light-absorbing non-crystal semiconductor material (e.g., polysilicon) over the narrow crystalline silicon ridge as a wide cap that extends laterally beyond the silicon ridge.

Some implementations of inventive guided-wave photodetector apparatuses based on the foregoing concepts employ conventional CMOS technology platforms for fabrication. To this end, the present disclosure also relates in part to the design and fabrication of photonic components, such as photodetectors based on light absorption by mid-bandgap states of a non-crystal semiconductor material, using existing conventional semiconductor manufacturing process technologies, i.e., without requiring any modifications to the semiconductor technology and without violating design rules associated with the semiconductor technology. For purposes of the present disclosure, such approaches for designing and fabricating photonic components are referred to as "zero-change photonics." If the semiconductor technology employed is a CMOS technology, the design and fabrication of photonic devices according to some of the principles set forth herein may be referred to as "zero-change CMOS photonics." In this "zero-change" approach, by relying on well-established and reliable high-yield semiconductor technologies for fabrication of integrated electronic circuits to be extended to photonic components, such electronic circuits may be further effectively integrated with photonic components at the complexity level of microprocessors without altering process flows and/or affecting fabrication yield. With the possibility for monolithic integration of electronic components with photonic components at the manufacturing cost and scale of consumer electronics, this integration approach has the potential for significant impact in connection with optical data communications ("optical datacom") and telecommunications ("telecom") applications.

Various CMOS photonics devices have already been demonstrated, such as low loss waveguides and high Q resonators, high efficiency vertical grating couplers (<0.5 dB insertion loss), high-speed and compact depletion-mode modulators, and highspeed (32 GHz @ 0.02 A/W) and high quantum efficiency silicon germanium photodetectors (5 GHz @ 0.55 A/W). The unique advantage of monolithic integration with electronics has enabled low-power transmitters (30 fJ/bit) and receivers (374 fJ/bit), and wavelength locking of the resonant filters and modulators. The combination of these devices and sub-systems enabled the first microprocessor to memory optical interconnect with 1.3 pJ/bit on-chip energy consumption.

However, one hurdle towards the extension of a CMOS photonics device platform to datacom and telecom applications has been the lack of a highspeed detector at wavelength standards for these applications (e.g., for light having wavelengths above 1000 nanometers, an particularly above 1200 nm, such as from 1300 nm to 1550 nm). To date, monolithic silicon germanium photodetectors based on zero-change CMOS photonics have been used for inter-chip interconnect applications and have high bandwidth and quantum efficiency—but their operation is limited to wavelengths below 1200 nm (e.g., due to the small mole fraction of germanium in CMOS).

In view of the foregoing, various embodiments disclosed herein relate to inventive guided-wave photodetector apparatus and fabrication methods for same, in which the photodetectors are sufficiently responsive generally in the infrared regime (e.g., from approximately 1000-2000 nanometers), and more particularly at datacom and telecom wavelengths (e.g., from 1300 nm to 1550 nm). As noted above, in some implementations such apparatus may be fabricated using zero-change photonics and/or employ inventive inverse ridge waveguide structures. Although exemplary embodiments based on zero-change fabrication processes are presented herein, the inventive inverse ridge guided-wave photodetector structure as described herein can also be implemented using other suitable techniques, including fabrication processes that are not zero-change processes (e.g., employing some degree of customization to conventional fabrication processes).

In one exemplary implementation, an inventive zero-change silicon-on-insulator (SOI) CMOS guided-wave photodetector apparatus is fabricated on an SOI substrate. The guided-wave photodetector includes a patterned crystalline silicon region in the SOI substrate to define a waveguide for guiding light. More specifically, the patterned crystalline silicon region is formed as a narrow crystalline silicon ridge flanked by shallow trench isolation, and a polysilicon region is disposed over the patterned crystalline silicon region as a wide polysilicon cap to form an inverse ridge waveguide structure to confine and guide the light. In some implementations, the polysilicon may be undoped or "intrinsic" while in other implementations the polysilicon may be pre-doped (e.g., depending on the CMOS process technology employed for fabrication). Sub-bandgap defect states present in the polysilicon region absorb infrared photons (e.g., having wavelengths corresponding to photo energies below the bandgap of the semiconductor in its crystalline form, for example at telecommunication wavelengths of 1550 nanometers) in the optical mode to generate electron-hole pairs in the polysilicon region. The polysilicon region also is formed so as to include a relatively higher concentration n-doped portion and a relatively higher concentration p-doped portion sufficiently distant from a guided mode in the waveguide structure so as to form a lateral p-n junction substantially parallel to a plane of the SOI substrate. The electron-hole pairs generated by the absorbed infrared photons in turn modulate a conductance in the lateral p-n junction in the polysilicon region when a bias voltage is applied across the lateral junction, thereby giving rise to a photocurrent corresponding to the absorbed infrared photons.

In other inventive examples, the inverse ridge waveguide structure described above is formed as a ring resonator structure, and the guided-wave photodetector apparatus further includes a bus inverse ridge waveguide structure to guide the optical mode of radiation to and from other photonic components (e.g., of an integrated electronic/photonic circuit) and to couple the optical mode of radiation to the ring resonator structure of the photodetector apparatus. In this example, the guided-wave photodetector apparatus includes a gap between the bus inverse ridge waveguide structure and the ring resonator structure such that a cross-coupling strength of the coupled optical mode of radiation substantially matches a round trip optical loss in the ring resonator structure.

In other inventive implementations, alternative techniques may be employed for light confinement in a photodetector apparatus. For example, a photonic bandgap may be introduced in a polysilicon layer by etching a 2D photonic crystal in the polysilicon layer. The photonic bandgap prohibits lateral propagation of light; in particular, light may be laterally confined by placing two photonic bandgaps spaced apart so as to form two sides of a waveguide structure. Since the continuity of the polysilicon is still intact, the structure can still be electrically contacted to make active devices, such as photodetectors. For example, in zero-change CMOS, a mask for defining polysilicon transistor gates can be used to define this photonic crystal/photonic bandgap structure in the fabrication processes.

Another inventive example is directed to a semiconductor fabrication method that uses a zero-change CMOS fabrication process technology to form a doped polysilicon region on a crystalline silicon substrate. The doped polysilicon region formed includes a p-doped portion and an n-doped portion so as to form a lateral junction that is substantially parallel to a plane of the crystalline silicon substrate. In one aspect, this fabrication method may utilize an advanced CMOS fabrication process technology that has a feature size of less than 65 nanometers. In one example, a CMOS fabrication process technology with a feature size of less than 45 nanometers can be used (e.g., 45 nm CMOS SOI process provided by GlobalFoundry and formerly IBM; see H. Meng, A. H. Atabaki, J. S. Orcutt, and R. J. Ram, *Opt. Express* 23, 32643 (2015), which publication is hereby incorporated herein by reference).

The publication by H. Meng, A. Atabaki, J. Orcutt, and R. Ram, entitled "Sub-bandgap polysilicon photodetector in zero-change CMOS process for telecommunication wavelength," *Optics Express* (2015): 23, 32643-32653, DOI: 10.1364/OE:23.032643, is also hereby incorporated herein by reference.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 4A and 4B show a normalized transmission response and photocurrent, respectively, of a micro-ring photodetector according to one inventive embodiment, for a resonance wavelength near 1550 nm.

DETAILED DESCRIPTION

Following below are more detailed descriptions of various concepts related to, and embodiments of, inventive guided-wave photodetector apparatus based on mid-bandgap states of semiconductor materials, and fabrication methods for same. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

Figure 1A:
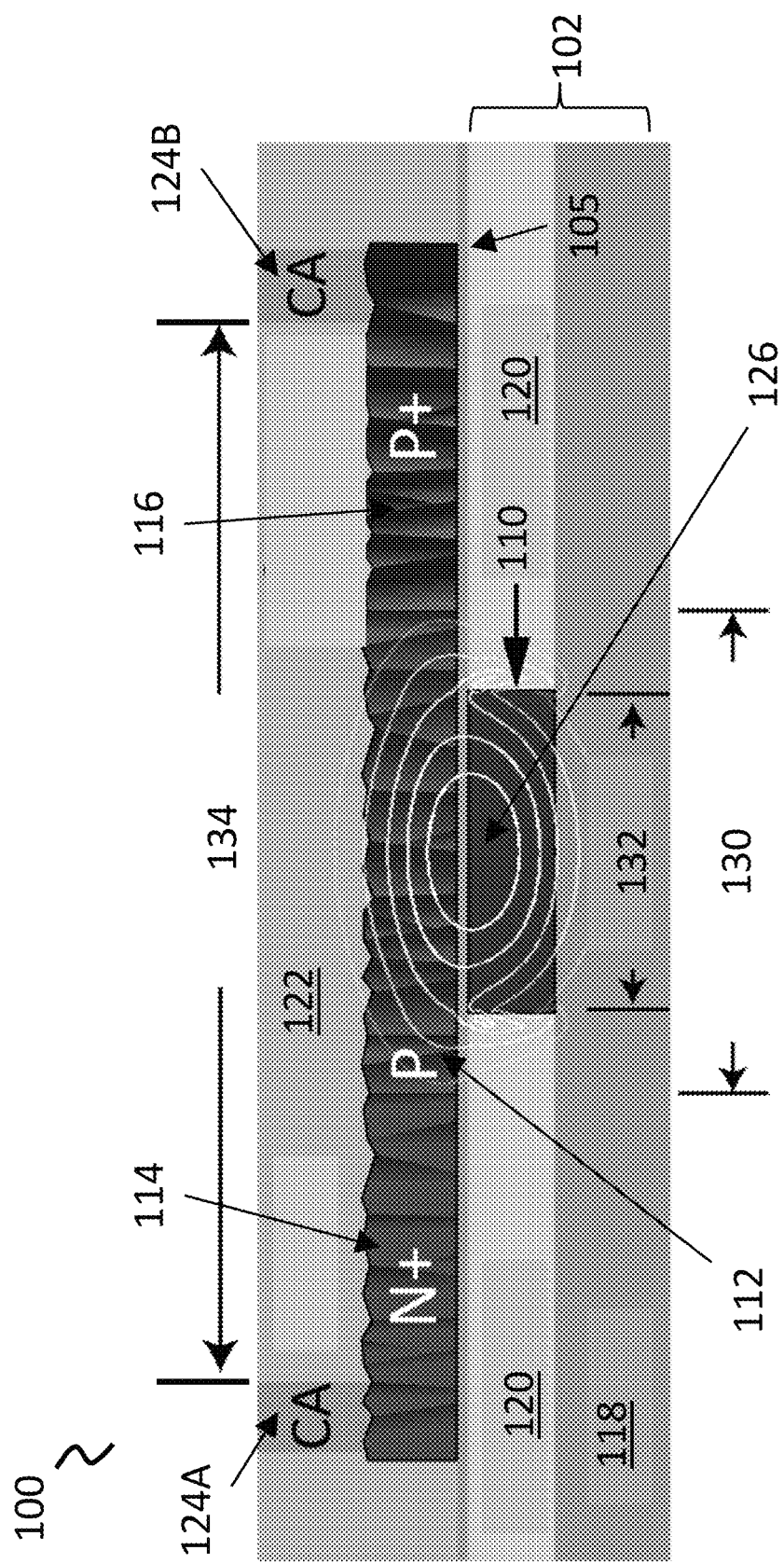
FIG. 1A is a cross-sectional view of a photodetector apparatus showing an inverse ridge guided-wave structure, according to one inventive embodiment.

FIG. 1A is a cross-sectional view of a guided-wave photodetector apparatus 100, according to one embodiment of the invention. As illustrated in FIG. 1A, the apparatus 100 includes a silicon-on-insulator (SOI) 102 substrate including a buried silicon dioxide ($SiO_2$) layer 118 below a crystalline silicon layer, which structure is commonly employed in conventional CMOS manufacturing process technologies as discussed further below.

In the embodiment of FIG. 1A, the apparatus 100 includes a patterned crystalline silicon region 110 formed in the crystalline silicon layer of the SOI substrate and flanked by shallow trench isolation regions 120. A polysilicon region 112 is formed on the patterned crystalline silicon region 110, above a thin region 105 of silicon oxide (gate oxide). In some implementations, the crystalline body silicon layer that is normally used to implement a transistor channel and source/drain, as well as the gate polysilicon layer, are both used in the design of the apparatus 100. In some implementations, the polysilicon may be undoped or "intrinsic" when formed on the crystalline silicon region 110, while in other implementations the polysilicon may be pre-doped when formed on the crystalline silicon region 110 (e.g., depending on the CMOS process technology employed for fabrication). In one example, a thickness of each of the regions 110 and 112 may be less than 100 nm.

As shown in FIG. 1A, the polysilicon region 112 includes an n-doped portion 114 and a p-doped portion 116. As noted above, in some CMOS process technologies, the polysilicon may be pre-doped (e.g., either n or p for the NFETs and PFETs); hence, the n-doped portion 114 and the p-doped portion 116 are relatively more heavily doped than a pre-doped portion (e.g., in the center of the polysilicon region) for those CMOS technologies that employ pre-doped polysilicon. The n-doped and p-doped portions form a lateral p-n junction in the doped polysilicon region 112 substantially parallel to a plane of the SOI structure 102. A first metal contact 124A is coupled to the n-doped portion 114 and a second metal contact 124B is coupled to the p-doped portion 116. The apparatus 100 further includes a dielectric layer 122 disposed over the doped polysilicon region 112, through which the first metal contact 124A and the second metal contact 124B are formed.

In the apparatus 100 of FIG. 1A, the patterned crystalline silicon region 110 and the doped polysilicon region 112 form an inverse ridge waveguide structure for an optical mode of radiation 126 (the optical mode of radiation is shown in FIG. 1A as contour lines of the Poynting vector of the waveguide mode centered around the center of the waveguide core 110). More specifically, the doped polysilicon region constitutes a wide polysilicon cap of the inverse ridge waveguide structure, and the patterned crystalline silicon region constitutes a narrow crystalline silicon ridge of the inverse ridge waveguide structure. The doped polysilicon region includes a plurality of sub-bandgap defect states to absorb photons of the optical mode of radiation (when the radiation is present in the waveguide) so as to generate a plurality of electron-hole pairs in the doped polysilicon region. The generated plurality of electron-hole pairs modulate a conductance of the lateral junction in the doped polysilicon region when a bias voltage is applied across the lateral junction (e.g., via the contacts 124A and 124B), thus generating a photocurrent corresponding to the radiation when present. In one aspect, a wavelength of the photons absorbed by the mid-bandgap states of the doped polysilicon is approximately 1550 nanometers.

With respect to the inverse ridge waveguide structure, the wide polysilicon cap includes a first side of the lateral junction and a second side of the lateral junction opposite the first side. The n-doped portion 114 of the doped polysilicon region constitutes the first side of the lateral junction, and the p-doped portion 116 of the doped polysilicon region constitutes the second side of the lateral junction. In one aspect, the wide polysilicon cap includes a pre-doped center portion (disposed between the n-doped portion constituting the first side of the lateral junction and the p-doped portion constituting the second side of the lateral junction), wherein the pre-doped center portion forms part of a waveguide region of the inverse ridge waveguide structure.

As noted above, in other aspects, the n-doped portion 114 and the p-doped portion 116 of the polysilicon cap are more heavily doped than the pre-doped center portion. In one example, a combination of doping mask layers were used to counter-dope one type of pre-doping and thereby implement a lateral p+/p/n+ junction. More specifically, one example of an advanced CMOS process employs a "halo" implantation that can be used to alleviate short channel effects. Since advanced CMOS process can include at least one halo and one extension implant for every type of transistor fabricated, a single mask can be used for both the extension and halo implantation—and in some instances, the doping concentration for these implantations can be higher than the normal source/drain dopings. Accordingly, one embodiment of the photodetector apparatus described herein exploits the halo/extension mask available in an advanced CMOS process for doping the polysilicon region and in some instances counter-doping the polysilicon regions with pre-doped portions used in advanced CMOS nodes.

In one aspect, a width 132 of the crystalline silicon region 110 (the narrow ridge) may be 600 nanometers to facilitate lateral confinement of the optical mode and also facilitate reduction of optical loss by pulling the optical mode away from a rough surface of the polysilicon region. In another aspect, a width 130 of the pre-doped center portion of the polysilicon region 112 (between the n-doped portion and the p-doped portion of the polysilicon cap) prevents significant overlap of the optical mode of radiation, when present, with the more highly doped n-doped portion and the p-doped portion of the polysilicon cap; in one example, the width 130 may be 800 nanometers. In yet another aspect, a width 134 between the metal contacts 124A and 124B may be 3600 nanometers.

Figure 1B:
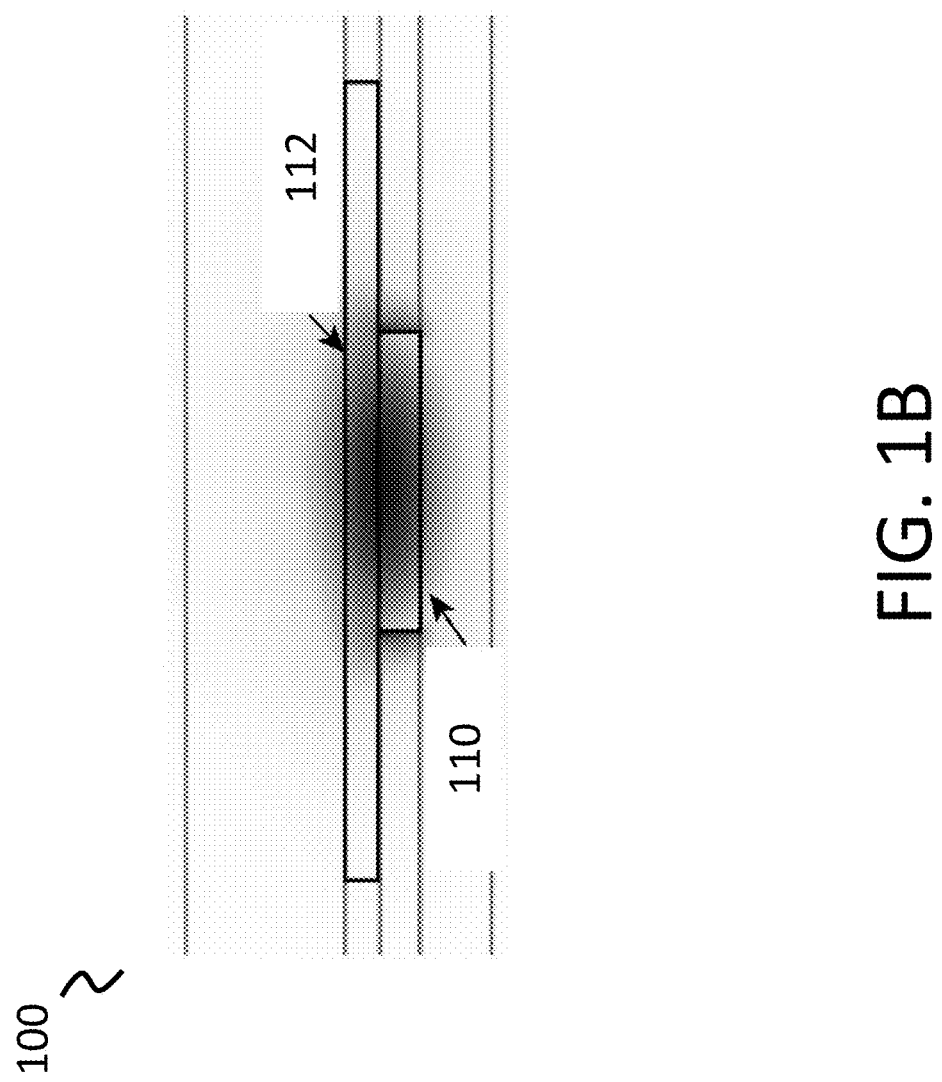
FIG. 1B shows a simulation result of the inverse ridge guided-wave photodetector apparatus of FIG. 1A in cross-sectional view, highlighting an overlap region in which an optical mode of radiation propagating through the waveguide overlaps with a doped polysilicon region, according to one inventive embodiment.

To visualize the optical mode of radiation during operation, a simulation of light distribution across the patterned crystalline silicon region 110 of the apparatus 100 is shown in FIG. 1B. The light propagating through the patterned crystalline silicon region 110 in the inverse ridge guided-wave photodetector apparatus 100 has a substantial overlap of radiation in the doped polysilicon region 112, in which the photocarriers are generated and swept across the lateral p-n junction. This simulation shows that the photodetector structure as fabricated with the dimensions and materials as described herein works well to confine the light and to produce photocarriers as intended.

Figure 2:
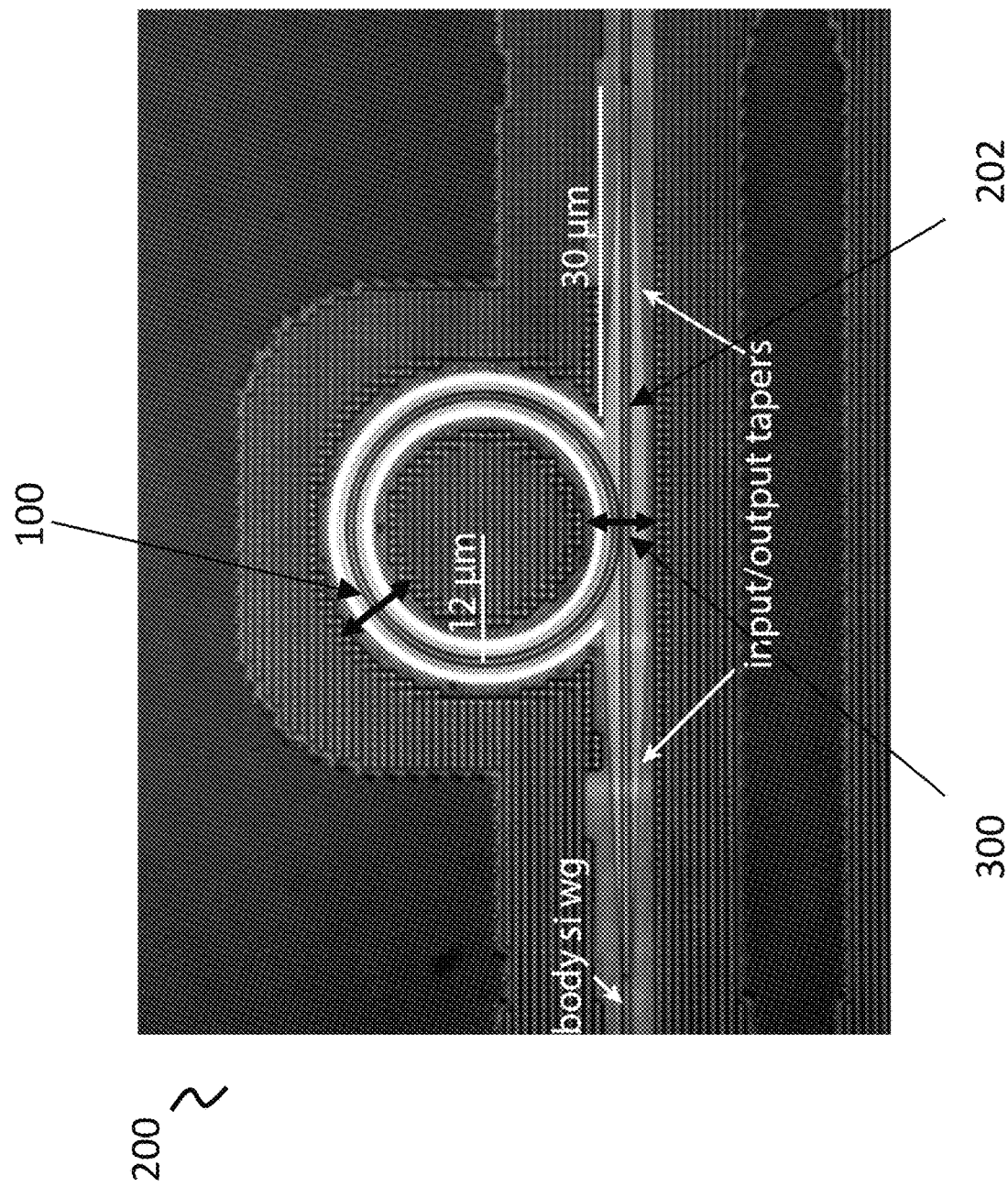
FIG. 2 is a top view of a micro-ring photodetector apparatus based on the structure shown in FIG. 1, disposed adjacent to a bus waveguide structure for coupling radiation to a micro-ring structure, according to one inventive embodiment.

FIG. 2 shows a resonant micro-ring photodetector with a diameter of 24 μm fabricated based on the aforementioned guided-wave photodetector structure discussed above in connection with FIG. 1A (a double-arrow 100 as indicated in FIG. 2 is the cross-section of the inverse ridge guided-wave photodetector apparatus 100 shown in FIG. 1A). In this exemplary implementation, the micro-ring photodetector structure 200 is designed as a ring to increase the interaction length, i.e., absorption of infrared photons and corresponding photocarrier generation within a more compact device. Light is coupled into the micro-ring photodetector structure 200 via whispering gallery mode through a bus waveguide 202 connected to a set of grating-couplers (not shown) disposed on both ends of the bus waveguide 202. The cross-sectional view of a coupling region 300 (indicated with another double-arrow) will be discussed in further detail in FIGS. 3A-3D. Since the input/output grating couplers (not shown) and the wave-guide cores are implemented in the low-loss patterned crystalline silicon region, in one aspect a taper in the doped polysilicon region is used to gradually transition the optical mode from the patterned crystalline silicon wave-guide core to the crystalline silicon/polysilicon hybrid detector region.

Figure 3A:
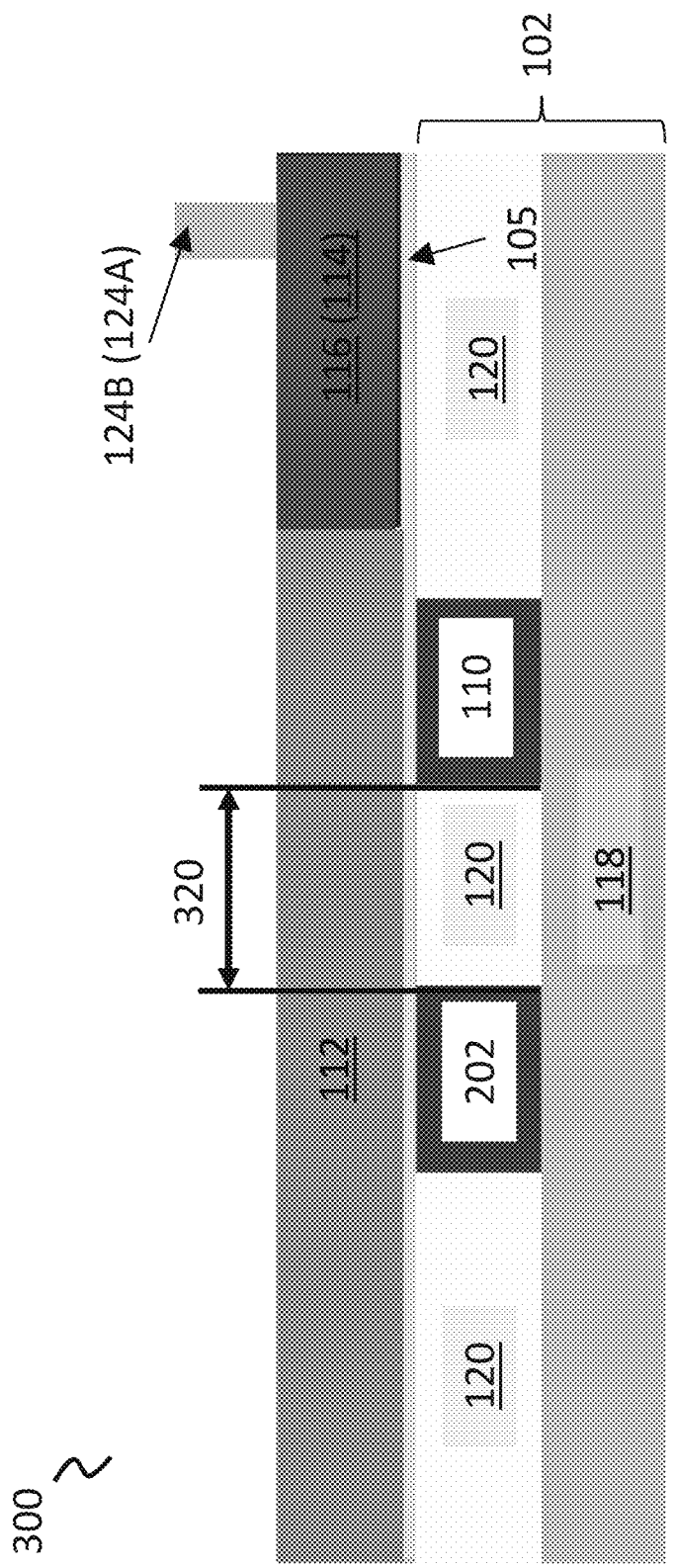
FIG. 3A is a cross-sectional view of the coupling region between the inverse ridge guided-wave structure of the micro-ring photodetector and the bus waveguide structure shown in FIG. 2, according to one inventive embodiment.

Referring now to FIG. 3A, the coupling region 300 includes the apparatus 100 and the bus waveguide 202. As shown in the cross-sectional view, the bus waveguide 202 is disposed across the shallow trench isolation region 120 from the patterned crystalline silicon region 110 formed in the crystalline silicon layer of the SOI substrate 102. A width (also referred to as gap size or merely "gap" 320) of the shallow trench isolation region 120 between the bus waveguide 202 and waveguide core 110 is a parameter for coupling that determines the cross-coupling strength between the bus waveguide and waveguide core of the ring-resonator structure. For example, to facilitate increased coupling between the bus waveguide and the ring-resonator structure, the round-trip optical loss of the ring-resonator structure is considered to be equal to the cross-coupling strength, which is in turn based on by the gap size 320 between the ring resonator and the bus waveguide.

Figure 3B:
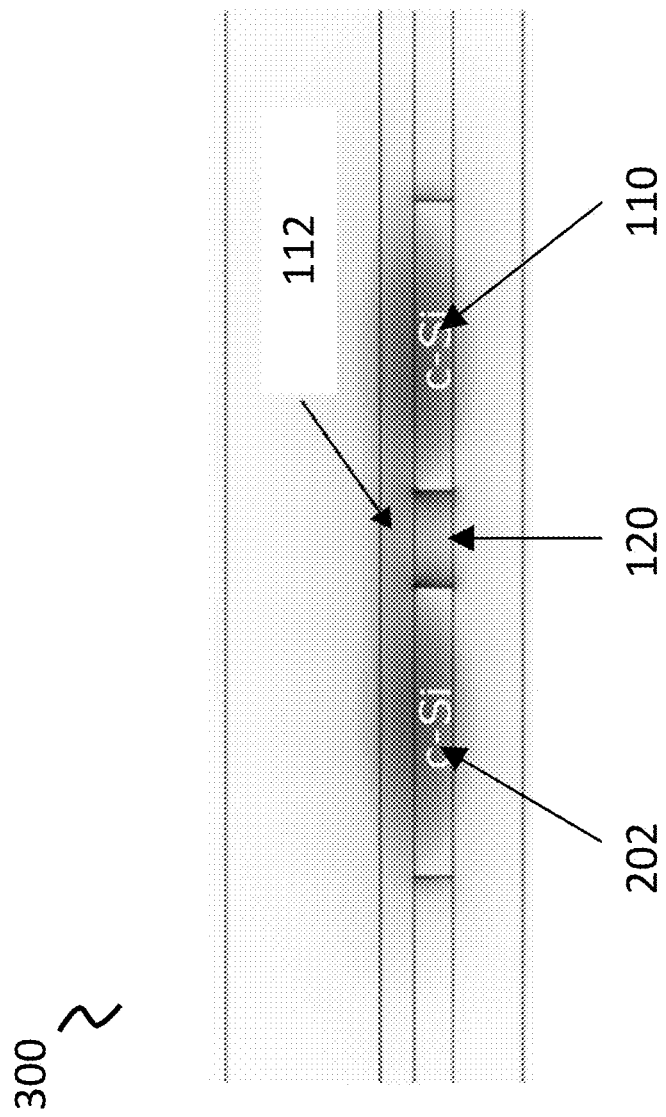
FIG. 3B shows a simulation result in the coupling region shown in FIG. 3A in cross-sectional view, highlighting coupling strength across the coupling region, according to one inventive embodiment.

To visualize the optical mode of radiation across the coupling region during operation, a simulation of the coupling region mode profile is shown in FIG. 3B. The light propagating through the bus waveguide 202 is coupled into the waveguide core 110 of the ring-resonator structure and they both have a substantial overlap of radiation in the doped polysilicon region 112. A number of devices with varying coupling gap sizes between 130 nm and 340 nm were designed and fabricated based on the expected range of polysilicon loss, and various parameters relating to radiation coupling were measured for optical wavelengths between 1520 nm and 1580 nm.

Figure 3C:
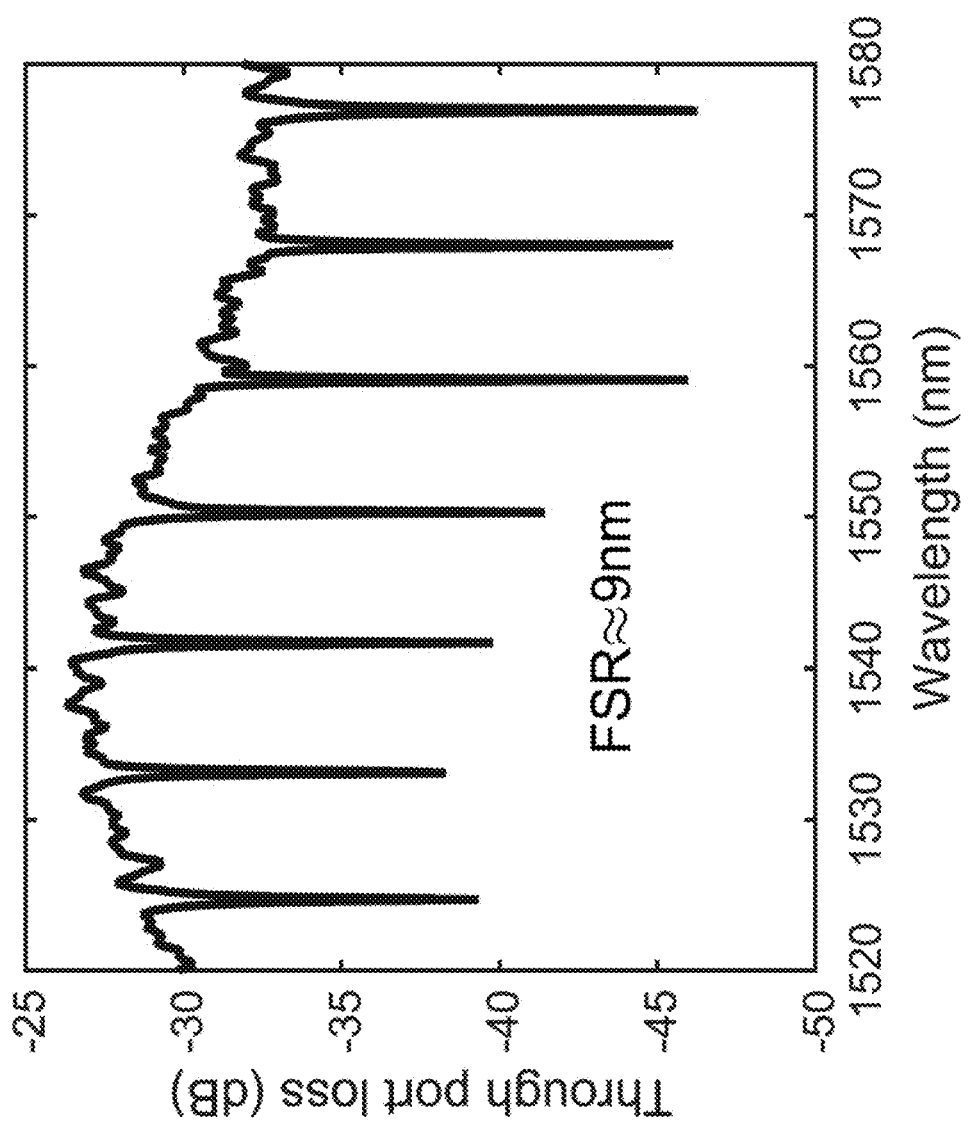
FIG. 3C shows a plot of resonance through port loss as a function of wavelength for the wavelengths between 1520 nm and 1580 nm for the structure shown in FIG. 3A.
Figure 3D:
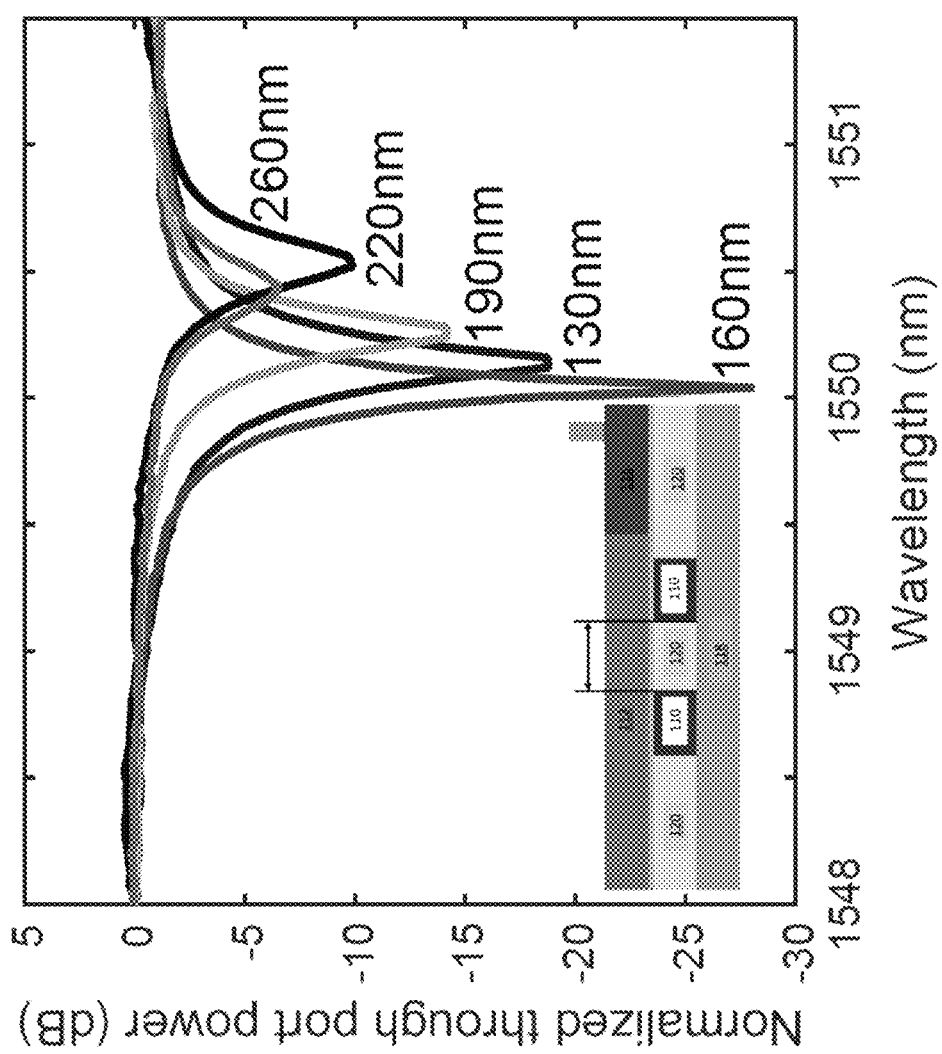
FIG. 3D shows a plot of throughput power as a function of gap size across the coupling region for gap sizes between 130 nm and 190 nm for the structure shown in FIG. 3A.

FIG. 3C shows resonance responses of the ring resonator photodetector in a plot of throughput loss as a function of wavelengths between 1520 nm and 1580 nm. Optical extinction of more than 10 dB is obtained in the whole wavelength range measured. The free spectral range (FSR) is also measured to be around 9 nm. The resonance condition of the ring resonator photodetectors fabricated with different coupling gap sizes between bus waveguide and waveguide core of the ring resonator structure are shown in FIG. 3D (red=160 nm, blue=130 nm, green=190 nm, purple=220 nm, black=260 nm). The data as shown in the plot in FIG. 3D indicate that the ring resonator photodetector with a gap size of 160 nm has the highest extinction ratio of more than 25 dB. This ring resonator photodetector has an intrinsic Q factor of 5000 and loss around 130 dB/cm. Additionally, it can be observed that for photodetectors with gap sizes in the range of 130 nm to 190 nm the extinction ratio remains above 10 dB corresponding to more than 90% of the power drop in the ring resonator. This indicates that the absorbed light in the photodetectors are not sensitive to process variations.

The devices shown in FIGS. 1A-3D may be fabricated using a 45-nm SOI CMOS process. Additional details of fabrication may be found in the publication J. S. Orcutt, B. Moss, C. Sun, J. Leu, M. Georgas, J. Shainline, E. Zgraggen, H. Q. Li, J. Sun, M. Weaver, S. Urosevic, M. Popovic, R. J. Ram, and V. Stojanovic, Opt. Express 20, 12222 (2012), which publication is hereby incorporated herein by reference. The devices can also be fabricated using a 65-nm SOI CMOS process or any other processes that is suitable for fabrication of such structures.

FIG. 4A, which shows a plot of the transmission spectrum of a resonant mode of the micro-ring guided-wave photodetector near 1550 nm with a loaded Q of approximately 2000 with 10 dB of optical extinction, according to one inventive embodiment. As fabricated, the free-spectral range of the photodetector is 9.4 nm. FIG. 4B shows a plot the photocurrent as a function of wavelength when the light is coupled into the micro-ring resonator under a 15 V reverse bias.

Figure 5:
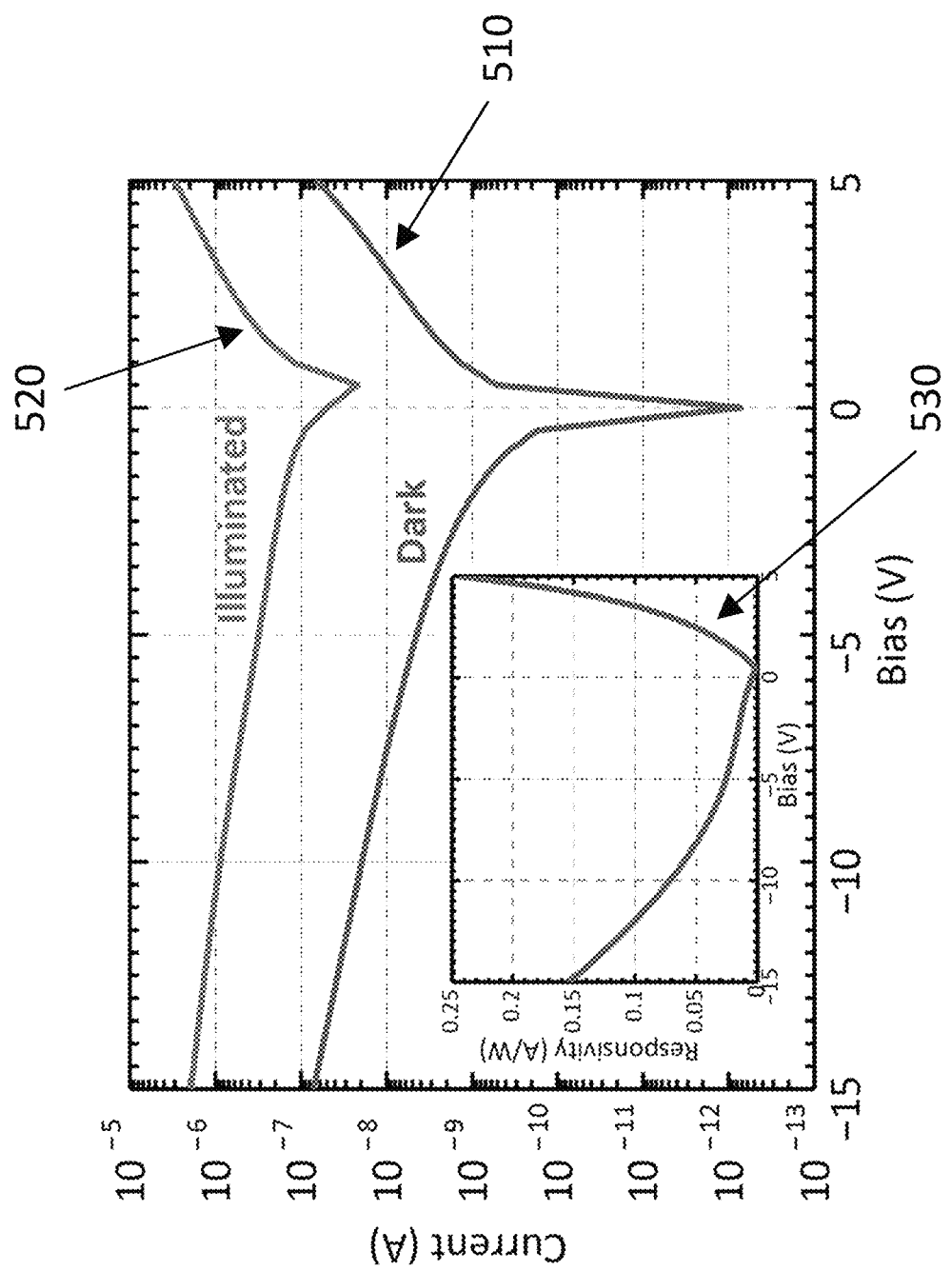
FIG. 5 shows a plot of current-voltage (I-V) curves of a micro-ring photodetector according to one inventive embodiment under dark and illumination conditions, and responsivity of the photodetector as a function of bias voltage.
Figure 6:
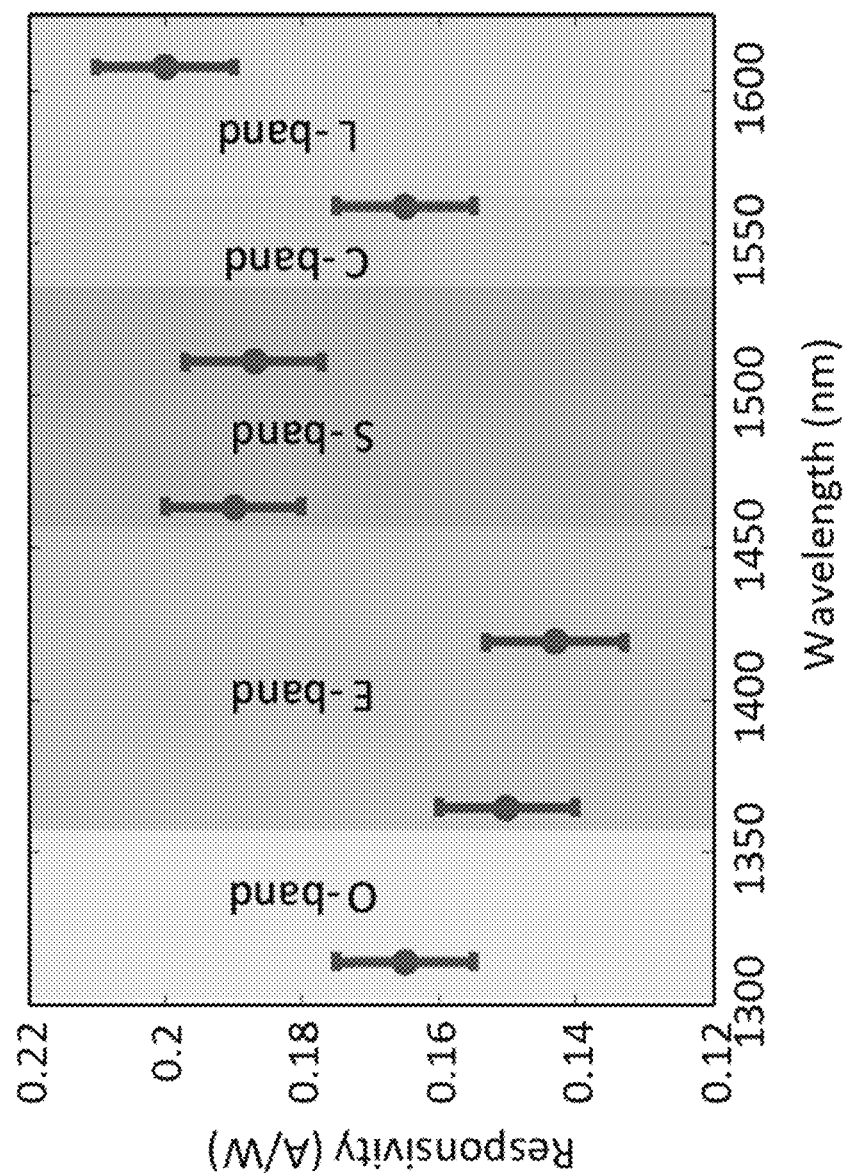
FIG. 6 shows a bar chart of responsivities of a guided-wave photodetector according to one inventive embodiment, under a reverse bias voltage and for wavelengths ranging from 1310 nm to 1610 nm.

When the wavelength of the radiation is tuned to this resonance around 1550 nm as shown in FIG. 5, the I-V curves in the plot shows the performance under dark condition (510) and illumination (520) by approximately 15 μW optical power in the waveguide. The inset in FIG. 5 shows a plot of responsivity as a function of applied bias of the device, indicating that the photodetector achieves 80 nA dark current and approximately 2 μA photocurrent corresponding to a 0.15 A/W responsivity at the 15 V reverse bias. The responsivity is measured over a large wavelength range from 1300 to 1600 nm shown in a plot in FIG. 6. The photodetector exhibits a range of responsivity between 0.14 and 0.2 A/W in this wavelength range. For these measurements, the circulating power inside the resonator is kept fixed by compensating for the variation of the grating coupler insertion loss and waveguide-resonator coupling condition over the entire range of the 300 nm wavelength span.

Although the turn-on voltage of the photodetector device is above 5 V forward bias, the high quantum efficiency and large bandwidth of the device are good indications that the device behaves well as a p-n diode under reverse bias with a strong electric field in the depletion region. The dimension of the depletion region was confirmed by measurements of the reverse current behavior as a function of the width of the p-doped portion ($W_p$). Through doping conductivity test structures, the p-doped portion 116 and the n-doped portion 114 have a carrier concentration of at least an order of magnitude higher than the center doped polysilicon region 112. As a result, the depletion region is expected to be almost entirely in the p-doped portion 116 of the doped polysilicon material/layer. As the reverse bias is applied and consequently the electric field is increased in the p-doped portion 116, the current is enhanced through the Poole-Frankel (PF) barrier lowering at the defects in the doped polysilicon region 112. This previously observed effect provides the enhancement of the reverse current as:

$$I_{PF} = I_0 \exp\left(\frac{q\beta_{PF}\sqrt{E_{dep}}}{KT}\right) \quad [1]$$
$$= I_0 \exp\left(\frac{q\beta_{PF}}{KT\sqrt{W_{dep}}}\sqrt{V}\right),$$

where $\beta_{PF}$ is the PF coefficient in polysilicon, q is the charge of an electron, V is the reverse bias voltage, and $E_{dep}$ and $W_{dep}$ are the E-field and the width of the depletion region. Equation [1] then becomes $\ln(I_{PF})=\ln(I_{PF})+(q\beta_{PF}/\sqrt{W_{dep}})\sqrt{V}$, which indicates that the slope of the $\ln(I_{PF})$ versus $\sqrt{V}$ is proportional to $q \beta_{PF}/(KT\sqrt{W_{dep}})$. The stated relationship and the previously characterized $\beta_{PF}$ in polysilicon can be used to estimate $W_{dep}$. Five photodetector devices with different $W_p$ from 0.6 um to 1.4 um are fabricated and tested; and for each device a lower and upper bound for $W_{dep}$ are estimated using the minimum and maximum $\beta_{PF}$ values reported for polysilicon as $(3.5\times10^{-4}$ (V·cm)$^{1/2}$ and $5\times10^{-4}$ (V·cm)$^{1/2}$).

Figure 7:
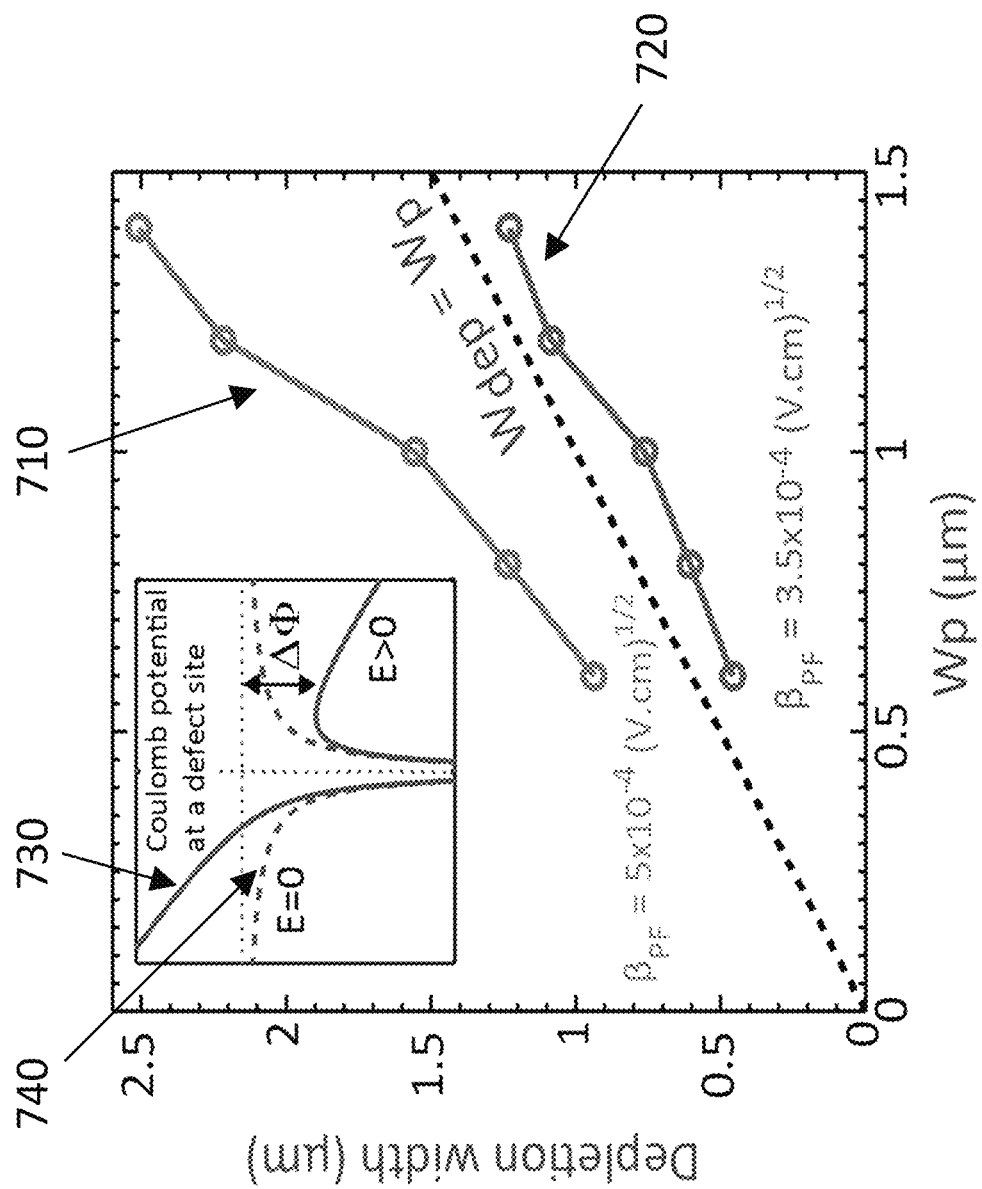
FIG. 7 shows a plot of modeled depletion widths for a lateral junction of a photodetector apparatus according to one inventive embodiment.

FIG. 7 shows the calculated results, which are plotted in a plot as the upper (710) and lower (720) bounds of $W_{dep}$ estimated through the approach explained above as a function of physical dimension of the p-doped portion, $W_p$. It is observed that the estimate of $W_{dep}$ follows $W_p$ to a good degree. Although the value of $\beta_{PF}$ in the materials used is not independently determined $\beta_{PF}$, the relative scaling of $W_{dep}$ and $W_p$ and close agreement for the lower bound of $\beta_{PF}$ is a good indication that the depletion width is close to $W_p$ and that there is a strong electric field inside the p-doped portion in reverse bias for assisting the collection of generated photocarriers. The dashed line in FIG. 7 shows the $W_p$ on the vertical axis to help visualize the comparison between the estimated $W_{dep}$ vs. $W_p$. The inset in FIG. 7 shows the mechanism of Poole-Frenkel effect, with the dashed and solid lines representing the Coulombic potential without and with an electric field and the Δϕ is the potential barrier lowering due to the electric field.

Figure 8:
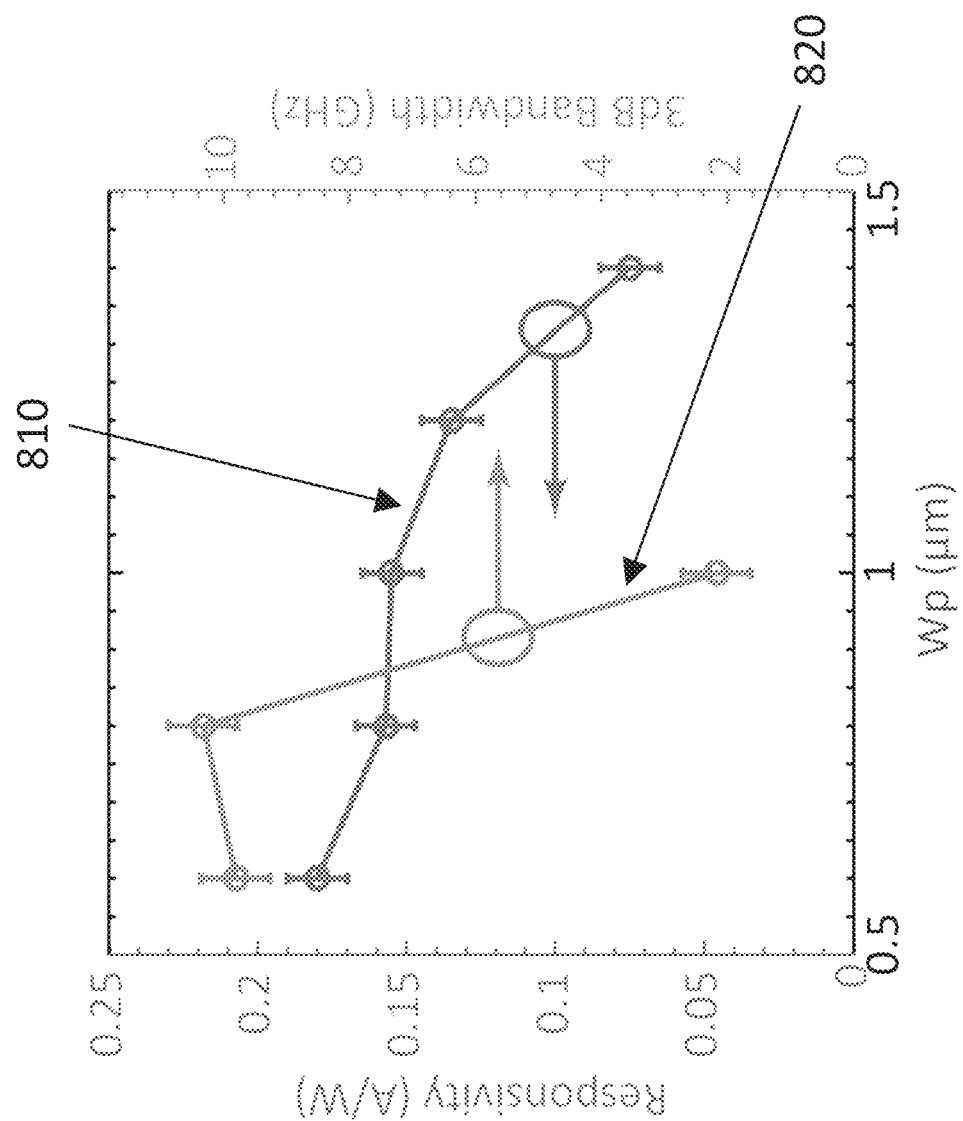
FIG. 8 shows a plot of responsivities and the 3-dB bandwidth of a photodetector apparatus according to one inventive embodiment based in part on the modeled widths of FIG. 7.

FIG. 8 shows a plot of responsivity values in curve 810 and RF bandwidth values in curve 820 of the fabricated photodetector devices as a function of widths of the p-doped portion, $W_p$. The curve 810 shows a maximum responsivity around the p-doped portion width around 800 nm.

Figure 9:
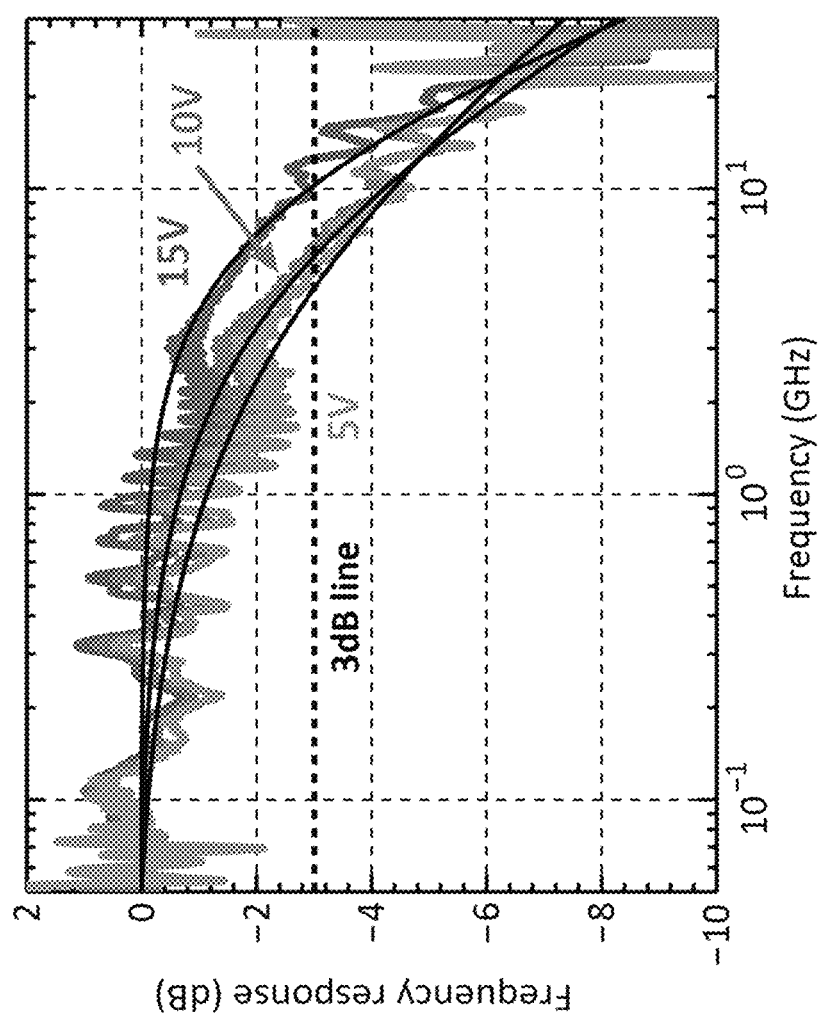
FIG. 9 shows a plot of frequency responses of the a photodetector apparatus according to one inventive embodiment under various bias voltages at a light wavelength of 1550 nm.
Figure 10B:
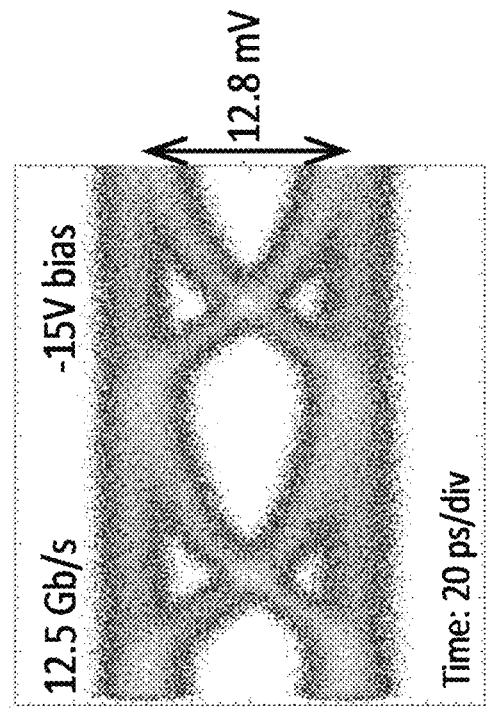
FIGS. 10A and 10 B are eye diagrams of a photodetector apparatus according to one inventive embodiment at 12.5 Gb/s under −10V, and −15V bias, respectively.
Figure 10A:
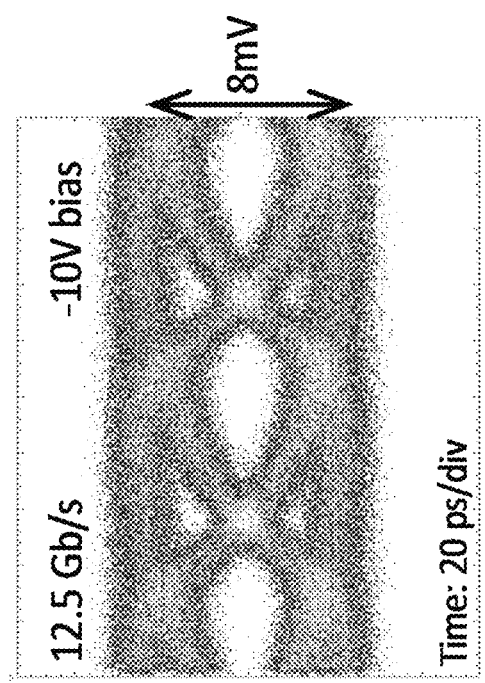

Furthermore, the frequency response of the photodetector is measured using a vector network analyzer and a lithium niobate electro-optic modulator to transfer the RF signal to the optical carrier. The measured results are shown in FIG. 9 for different biasing conditions. It has been observed that the photodetector device has a 3 dB bandwidth of 5 GHz, 8 GHz and 10 GHz, under 5V, 10V, and 15V reverse bias, respectively. To confirm the performance of this photodetector device for high data-rate digital communications, eye diagrams are obtained by measuring the photocurrent for a $2^{31}-1$ bit pseudorandom binary sequence (PRBS) optical signal. FIGS. 10A and 10B show the eye diagrams for a 12.5 Gb/s PRBS signal under 10V and 15V bias, respectively, showing completely open eyes at this data-rate. The photodetector device is measured to be fast enough to detect 20 Gb/s non-return-to-zero (NRZ) signals based on its 3 dB bandwidth. The fast device response along with the broad spectral bandwidth makes the device appealing for a wide range of high data-rate interconnect and communications applications, such as Ethernet, FTTH, and telecommunications.

Further improvements, especially in the operating voltage, can be implemented. In some implementations, the photodetector device does not exhibit a clear forward turn-on below 5 V, which indicates that the junction is not optimized. For instance, multiple ion-implantations with different polarities (e.g., source/drain halo and extension) and implant conditions (e.g. angle of incidence) are associated with a single mask layer in the 45 nm SOI process used for this work. The results from using multiple fabrication processes in a complex diode structure sometimes require larger voltages to achieve a full depletion. Through a combination of different doping masks, an optimized diode junction with a strong built-in electric field can lower the operating voltage of the photodetector device as described herein to a few volts without degrading quantum efficiency and bandwidth.

Overall, via several inventive exemplary implementations, a high-speed photodetector is fabricated via a zero-change CMOS with 10 GHz bandwidth that covers the entire telecom and datacom wavelength range with a responsivity of more than 0.14 A/W. Although described herein via various exemplary implementations that the fabrication process used in the production of the inventive inverse ridge guided-wave photodetector apparatus is a zero-change CMOS process, in other inventive implementations, a substantially similar or similar device can be fabricated using a custom or any other suitable CMOS fabrication processes. Said another way, the high-speed infrared photodetector can be fabricated via any unmodified microelectronics CMOS process that can address these communications applications. This photodetector device, combined with the monolithic receiver circuits, optical transmitters, efficient thermo-optic tunable elements with wavelength stabilization circuits that are already demonstrated in the same process, can enable single-chip transceiver solutions at the cost and scale of consumer electronics.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of" or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A zero-change silicon-on-insulator (SOI) CMOS guided-wave photodetector apparatus, comprising:
   a patterned crystalline silicon region formed in a SOI substrate; and
   a doped polysilicon region formed on the patterned crystalline silicon region, the doped polysilicon region including an n-doped portion and a p-doped portion so as to form a lateral junction substantially parallel to a plane of the SOI substrate,
   wherein:
   the patterned crystalline silicon region and the doped polysilicon region form an inverse ridge waveguide structure for an optical mode of radiation;
   the doped polysilicon region constitutes a wide polysilicon cap of the inverse ridge waveguide structure; and
   the patterned crystalline silicon region constitutes a narrow crystalline silicon ridge of the inverse ridge waveguide structure.

2. The photodetector apparatus of claim 1, wherein the doped polysilicon region is formed on the patterned crystalline silicon region using a CMOS fabrication process technology having a feature size of less than 65 nanometers.

3. The photodetector apparatus of claim 2, wherein the zero-change CMOS fabrication process technology is a 45 nanometer SOI CMOS process technology.

4. The photodetector apparatus of claim 1, wherein:
   the doped polysilicon region includes a plurality of sub-bandgap defect states to absorb photons of the optical mode of radiation, when present, so as to generate a plurality of electron-hole pairs in the doped polysilicon region; and
   the generated plurality of electron-hole pairs modulate a conductance of the lateral junction in the doped polysilicon region when a bias voltage is applied across the lateral junction.

5. The photodetector apparatus of claim 4, wherein a wavelength of the photons is approximately 1550 nanometers.

6. The photodetector apparatus of claim 1, wherein:
   the wide polysilicon cap includes a first side of the lateral junction and a second side of the lateral junction opposite the first side;
   the n-doped portion of the doped polysilicon region constitutes the first side of the lateral junction; and
   the p-doped portion of the doped polysilicon region constitutes the second side of the lateral junction.

7. The photodetector apparatus of claim 6, wherein:
   the wide polysilicon cap includes a center portion disposed between the n-doped portion constituting the first side of the lateral junction and the p-doped portion constituting the second side of the lateral junction, wherein the center portion forms part of a waveguide region of the inverse ridge waveguide structure for the optical mode of radiation.

8. The photodetector apparatus of claim 7, wherein the center portion is a pre-doped center portion.

9. The photodetector apparatus of claim 8, wherein:
   the n-doped portion and the p-doped portion of the polysilicon cap are more heavily doped than the pre-doped center portion; and
   a width of the pre-doped center portion, between the n-doped portion and the p-doped portion of the polysilicon cap, prevents significant overlap of the optical mode of radiation, when present, with the n-doped portion and the p-doped portion of the polysilicon cap.

10. The photodetector apparatus of claim 1, wherein the SOI substrate comprises:
    a buried oxide layer on which the patterned crystalline region is formed; and
    a plurality of shallow trench isolation regions disposed laterally to the patterned crystalline silicon region.

11. The photodetector apparatus of claim 10, further comprising:
    a gate oxide layer disposed between the patterned crystalline silicon region and the doped polysilicon region;
    a first metal contact in electrical contact with the n-doped portion of the doped polysilicon region; and
    a second metal contact in electrical contact with the p-doped portion of the doped polysilicon region.

12. The photodetector apparatus of claim 11, further comprising a dielectric layer disposed over the doped polysilicon region, wherein the first metal contact and the second metal contact are formed through the dielectric layer.

13. The photodetector apparatus of claim 11, wherein a first width of the patterned crystalline silicon region, between the plurality of shallow trench isolation regions, is 600 nanometers.

14. The photodetector apparatus of claim 13, wherein
    the wide polysilicon cap includes a center portion disposed between the n-doped portion constituting the first side of the lateral junction and the p-doped portion constituting the second side of the lateral junction, wherein the center portion forms part of a waveguide region of the inverse ridge waveguide structure for the optical mode of radiation; and a second width of the pre-doped center portion of the polysilicon cap is 800 nanometers.

15. The photodetector apparatus of claim 1, wherein:
the inverse ridge waveguide structure is formed as a ring resonator structure; and
the photodetector apparatus further includes a bus inverse ridge waveguide structure to guide the optical mode of radiation, when present, and to couple the optical mode of radiation to the ring resonator structure.

16. The photodetector apparatus of claim 15, further including a gap between the bus inverse ridge waveguide structure and the ring resonator structure such that a cross-coupling strength of the coupled optical mode of radiation substantially matches a round trip optical loss in the ring resonator structure.

17. The photodetector apparatus of claim 16, wherein:
a radius of the ring resonator structure is 12 micrometers; and
the gap between the bus inverse ridge waveguide structure and the ring resonator structure is between 130 nanometers and 190 nanometers.

18. A guided-wave photodetector apparatus, comprising:
a first semiconductor region on a substrate; and
a non-crystal semiconductor region formed on the first semiconductor region, the non-crystal semiconductor region including:
a plurality of mid-bandgap defect states to absorb radiation, when present in the non-crystal semiconductor region, having a wavelength of greater than 1200 nanometers and to generate a plurality of electron-hole pairs in the non-crystal semiconductor region corresponding to the absorbed radiation;
a p-doped portion;
an n-doped portion; and
a lateral p-n junction formed between the p-doped portion and the n-doped portion and substantially parallel to a plane of the substrate, the p-n junction having a depletion width of about 400 nm or greater along the plane of the substrate, wherein the generated plurality of electron-hole pairs modulate a conductance of the lateral p-n junction when a bias voltage is applied across the lateral junction.

19. The photodetector apparatus of claim 18, wherein the non-crystal semiconductor region includes one of poly-crystalline silicon, poly-crystalline silicon germanium (pSiGe), amorphous silicon (aSi), and amorphous silicon germanium (aSiGe).

20. A guided-wave photodetector comprising:
a first semiconductor region on a substrate; and
a non-crystal semiconductor region formed on the first semiconductor region, the non-crystal semiconductor region including:
a plurality of mid-bandgap defect states to absorb radiation, when present in the non-crystal semiconductor region, having a wavelength of greater than 1200 nanometers and to venerate a plurality of electron-hole pairs in the non-crystal semiconductor region corresponding to the absorbed radiation; and
a lateral p-n junction substantially parallel to a plane of the substrate, wherein the generated plurality of electron-hole pairs modulate a conductance of the lateral p-n junction when a bias voltage is applied across the lateral junction,
wherein:
the first semiconductor region and the non-crystal semiconductor region form an inverse ridge waveguide structure for an optical mode of the radiation;
the non-crystal semiconductor region constitutes a wide cap of the inverse ridge waveguide structure; and
the first semiconductor region constitutes a narrow ridge of the inverse ridge waveguide structure.

21. The photodetector apparatus of claim 20, wherein the wavelength of the radiation is approximately 1300 nanometers.

22. The photodetector apparatus of claim 20, wherein the wavelength of the radiation is approximately 1550 nanometers.

23. The photodetector apparatus of claim 20, wherein the wide cap includes:
an n-doped side of the lateral junction and a p-doped side of the lateral junction opposite the n-doped side; and
a center portion disposed between the n-doped side and the p-doped side, wherein the center portion forms part of a waveguide region of the inverse ridge waveguide structure for the optical mode of the radiation.

24. The photodetector apparatus of claim 23, wherein:
the n-doped side and the p-doped side of the wide cap are more heavily doped than the center portion; and
a width of the center portion, between the n-doped side and the p-doped side, prevents significant overlap of the optical mode of the radiation, when present, with the n-doped side and the p-doped side of the wide cap.

25. The photodetector apparatus of claim 24, wherein the center portion is a pre-doped center portion.

26. The photodetector apparatus of claim 24, wherein:
the first semiconductor region is crystalline silicon; and
the non-crystal semiconductor region is doped polysilicon.

27. The photodetector apparatus of claim 20, wherein:
the inverse ridge waveguide structure is formed as a ring resonator structure; and
the photodetector apparatus further includes a bus inverse ridge waveguide structure to guide the optical mode of the radiation, when present, and to couple the optical mode of the radiation to the ring resonator structure.

28. The photodetector apparatus of claim 27, further including a gap between the bus inverse ridge waveguide structure and the ring resonator structure such that a cross-coupling strength of the coupled optical mode of radiation substantially matches a round trip optical loss in the ring resonator structure.

29. The photodetector apparatus of claim 28, wherein:
a radius of the ring resonator structure is 12 micrometers; and
the gap between the bus inverse ridge waveguide structure and the ring resonator structure is between 130 nanometers and 190 nanometers.

* * * * *

UNITED STATES PATENT AND TRADEMARK OFFICE
CERTIFICATE OF CORRECTION

PATENT NO. : 10,043,925 B2
APPLICATION NO. : 15/250594
DATED : August 7, 2018
INVENTOR(S) : Ram et al.

Page 1 of 1

It is certified that error appears in the above-identified patent and that said Letters Patent is hereby corrected as shown below:

In the Claims

Column 15 Claim 20, Line 56 should read:
-- 1200 nanometers and to generate a plurality of --

Signed and Sealed this
Twenty-sixth Day of March, 2019

Andrei Iancu
*Director of the United States Patent and Trademark Office*